(12) United States Patent
Petzold et al.

(10) Patent No.: US 6,559,808 B1
(45) Date of Patent: May 6, 2003

(54) LOW-PASS FILTER FOR A DIPLEXER

(75) Inventors: Jörg Petzold, Bruchköbel (DE); Johannes Beichler, Rodgau (DE); Dirk Heumann, Nidderau (DE)

(73) Assignee: Vacuumschmelze GmbH, Hanau (DE)

( * ) Notice: Subject to any disclaimer, the term of this patent is extended or adjusted under 35 U.S.C. 154(b) by 0 days.

(21) Appl. No.: 09/623,252

(22) PCT Filed: Mar. 2, 1999

(86) PCT No.: PCT/DE99/00550
§ 371 (c)(1),
(2), (4) Date: Nov. 14, 2000

(87) PCT Pub. No.: WO99/45643
PCT Pub. Date: Sep. 10, 1999

(30) Foreign Application Priority Data

Mar. 3, 1998 (DE) .......................... 198 09 021

(51) Int. Cl.⁷ .............................................. H01Q 1/00
(52) U.S. Cl. .................... 343/787; 335/297; 148/304
(58) Field of Search .................. 148/304, 306, 148/307, 310, 311, 313, 315; 343/787; 335/297

(56) References Cited

U.S. PATENT DOCUMENTS 4,938,267 A * 7/1990 Hasegawa .................. 148/304
5,548,255 A * 8/1996 Spielman .................... 333/132
5,567,537 A  10/1996 Yoshizawa et al.
5,793,265 A * 8/1998 Spielman .................... 333/132

FOREIGN PATENT DOCUMENTS

| EP | 0 505 595 A | 9/1992 |
| EP | 0 677 938 A | 10/1995 |
| EP | 0 780 854 A1 | 12/1996 |
| WO | WO 00/30132 | * 3/2000 |

OTHER PUBLICATIONS

Fachkunde Elektrotechnik, Europa–Fachbuchreihe für elektrotechnische Berufe, pp. 85, 448, 449, Verlag Europa Lehrmittel, 1984, Wuppertal, Germany.

International Preliminary Examination Report in PCT/DE99/00550.

* cited by examiner

Primary Examiner—John Sheehan
(74) Attorney, Agent, or Firm—Dean W. Russell, Esq.; Kilpatrick Stockton LLP

(57) ABSTRACT

Low-pass filter for a diplexer in an ADSL communications system comprising a low-pass filter (8) with chokes (9). Said chokes (9) have magnetic cores made of an alloy, especially a nanocrystalline or amorphous alloy.

17 Claims, 4 Drawing Sheets

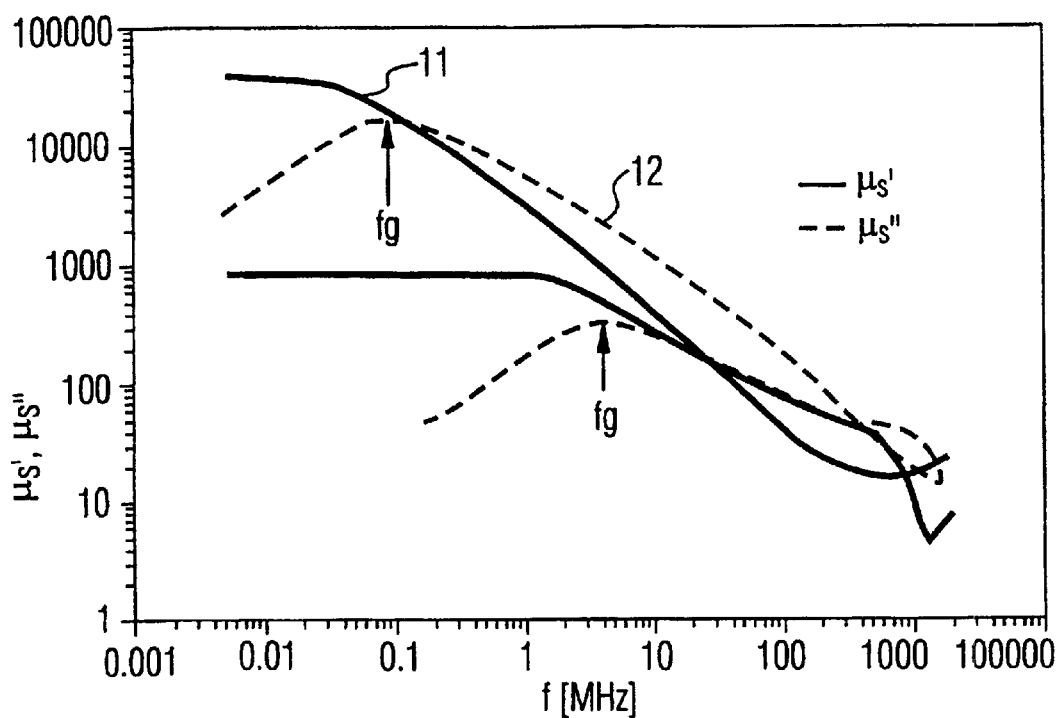
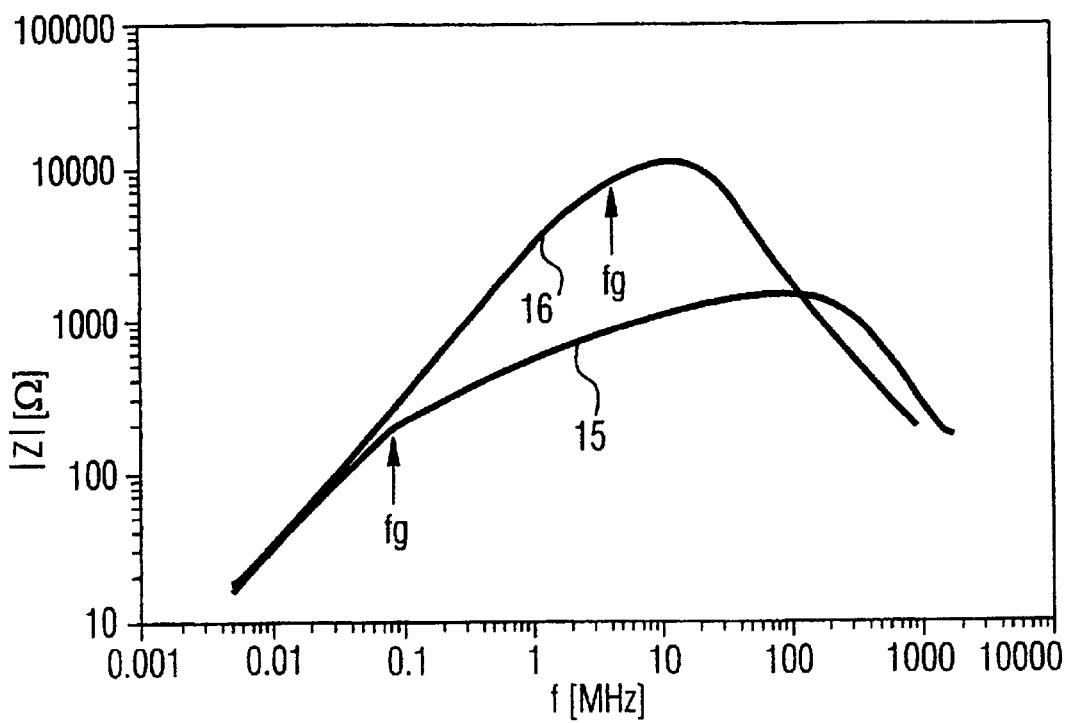

LOW-PASS FILTER FOR A DIPLEXER

The invention relates to a low-pass filter for a diplexer to separate low-frequency signals of analog communications systems from high-frequency signals of digital communications systems with a plurality of longitudinal inductances connected in series and formed by means of magnetic cores.

The magnetic cores heretofore used were RM4, RM6, RM8 as well as other ferrite shell cores made of core materials such as, for example, N27 and N48. The required direct field bias capability and the necessary linearity of the hysteresis loop were achieved by means of shear by slitting the ferrite core.

A drawback of shear is that it causes the effective core permeability to be decreased to values of about 200. To reach the required magnetizing inductance, the volume of the ferrite core must therefore be very large, so that a low-pass filter made of ferrite cores requires a lot of space. A further disadvantage of the ferrite cores is the high number of turns of the primary and secondary windings, which may cause ohmic losses and capacitive interference effects.

EP 0 677 938 describes a diplexer comprising a low-pass filter and a high-pass filter. The low-pass filter has longitudinal inductances that are connected in series and are formed by means of ferromagnetic cores.

EP 0 780 854 describes a current-compensated radio interference suppression choke that has a magnetic core made of a nanocrystalline alloy. The magnetic core has a permeability ranging from 10,000 to 60,000, a saturation induction greater than 1 Tesla and a specific resistance greater than 90 $\mu\Omega$. Based on the high permeability and the high saturation induction, the current-compensated radio interference suppression choke has a particularly small configuration. The properties of the nanocrystalline alloy are such that good interference suppression is achieved despite the small configuration of the radio interference suppression choke.

Based on this prior art, it is the object of the invention to create a low-pass filter with low unit volume that meets the requirements for application in a diplexer with respect to direct field bias capability and filter quality.

This object is attained according to the invention in that the magnetic cores are made of an alloy and the harmonics of the low-frequency signals can be suppressed by the impedance of the longitudinal inductances, which increase with increasing frequency.

Amorphous and nanocrystalline alloys make it possible to produce magnetic cores with high saturation induction and a broad range of permeability values. Compared to conventional ferrite cores, magnetic cores made of an amorphous or nanocrystalline alloy have therefore a substantially smaller unit volume with comparable magnetic properties. It is difficult, however, to produce magnetic cores of amorphous or nanocrystalline alloys in such a way that the hysteresis loop has the linearity required for application in broadband communications systems. A high measure of linearity is required, however, to ensure constant permeability and thus constant inductance of the low-pass filter chokes. Otherwise dimensioning of the low-pass filter chokes is made substantially more difficult. It is generally required, however, to connect several inductances in series to obtain the required filter quality. This series connection of the longitudinal inductances increases the interference attributable to non-linearities of the hysteresis loop. The harmonics produced by non-linearities of the hysteresis loops are attenuated, however, by the impedance of the longitudinal inductances, which increases with increasing frequency. It is thus possible, despite the lack of linearity of the hysteresis loops of the employed magnetic cores, to build a low-pass filter from an amorphous or nanocrystalline alloy, which satisfies the linearity requirements of the transfer characteristic. Due to the higher saturation induction and permeability of the nanocrystalline and amorphous materials compared to ferrites, smaller configurations for the magnetic core furthermore result.

The preferred alloys for use in low-pass filters are the subject of the dependent claims.

The invention will now be described in greater detail with reference to the attached drawings in which:

FIG. 5 shows the frequency response of the real part and the imaginary part of the permeability of low-pass filter chokes;

FIG. 6 shows the frequency response of the magnitude of the impedance of the low-pass filter chokes of FIG. 5.

Since VDSL splitters have not yet been defined in every detail, ADSL system components are primarily described below. Based on current knowledge, it has to be assumed that the requirements for the inductive components for the VDSL low-pass system will largely correspond to those of the ADSL low-pass system.

Figure 1:
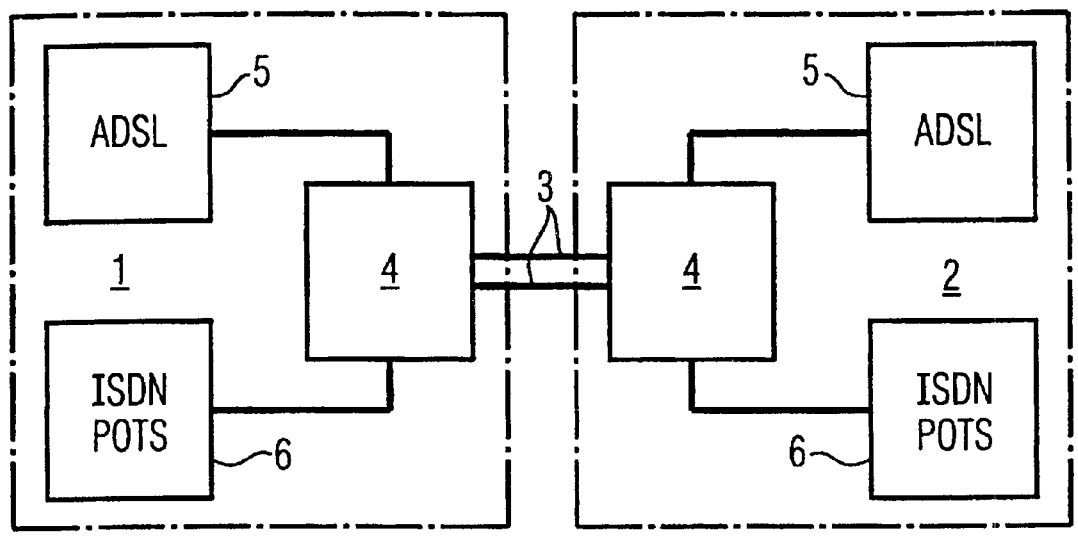
FIG. 1 is an overview of the connection between a local switching center and a subscriber side network termination.

As shown in FIG. 1, in the ADSL (Asymmetric Digital Subscriber Line) telecommunications system, an ADSL-capable digital local switching center 1 is connected to an ADSL modem 2, the subscriber side network termination, via a public two-wire line 3. POTS (Plain Old Telephone System) or ISDN (Integrated Services Digital Network) connections may run synchronously via the two-wire line 3. The separation and transmission of the low-frequency (POTS, ISDN) and the high-frequency (ADSL) components is carried out by diplexers 4 (POTS, ISDN splitters), which are located at the ends of the public two-wire line 3. The high-frequency ADSL signals running over the public two-wire line 3 are directed into an ADSL branch 5 by the diplexers 4, while the low-frequency POTS and ISDN signals are respectively directed into a POTS/ISDN branch 6 by the diplexers 4.

The diplexer 4 thus comprises a high-pass filter 7 and a low-pass filter 8, which is formed of low-pass filter chokes 9 and capacitors 10.

Figure 2:
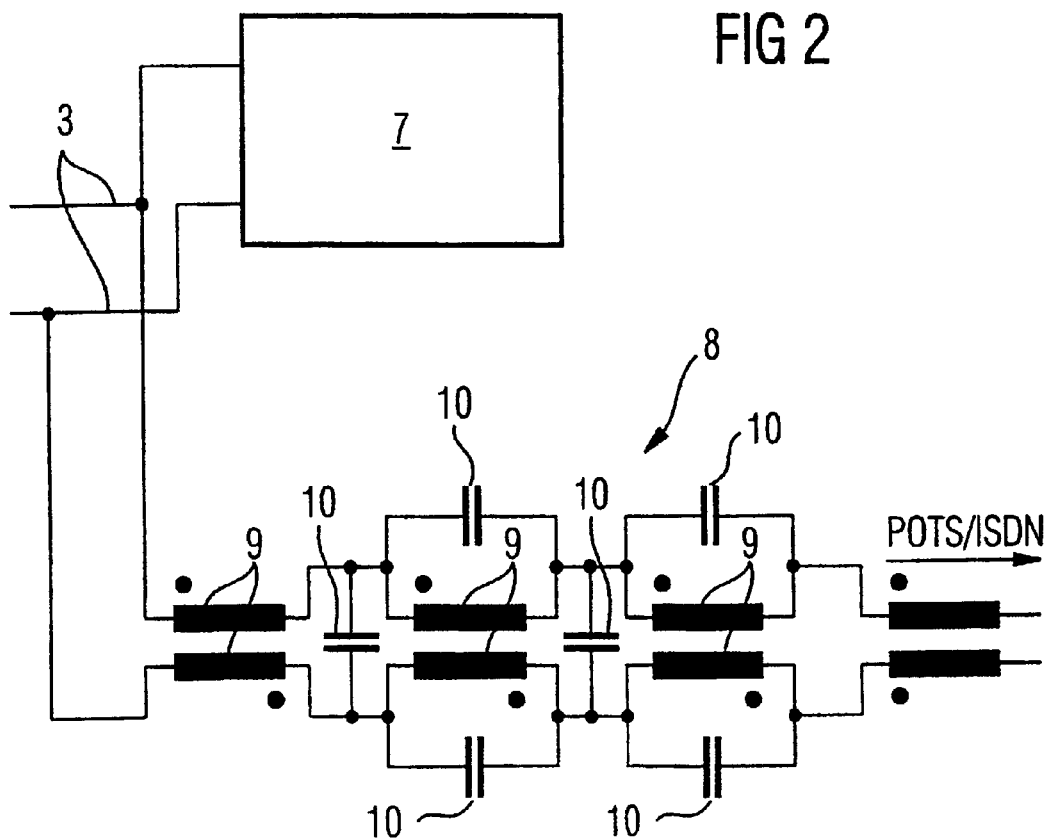
FIG. 2 depicts a diplexer with a high-pass filter and a low-pass filter.

It should be noted that different embodiments are possible for the low-pass filter 8. For example, the low-pass filter 8 as shown in FIG. 2 may be made exclusively of passive components or may contain active components in addition. The low-pass filter chokes 9 presented here, however, may be used independently of the corresponding low-pass filter 8.

A distinction is drawn depending on the transmission system between the DMT (discrete multitone) system and the CAP (carrierless amplitude phase modulation) system. The codings primarily affect the spectral distribution of the exciting current of the high-pass branch 5 of the diplexer 4.

The maximum amplitude can be up to $U_{ac}$=30 $V_{pp}$ in the ADSL system and up to $U_{ac}$=15 $V_{pp}$ in the POTS system. A direct current $I_{dc}$ (POTS)<100 mA flows through the POTS branch and a direct current $I_{dc}$ (ISDN)<80 mA through the ISDN branch. In POTS systems, there is also a maximum bell current $I_{ac}$ the magnitude and frequency of which depends on the configuration of the bell generator. These currents result in a DC bias of the low-pass filter chokes 9, the magnitude of which is decisively determined by the configuration of the low-pass filter choke 9 and the material used for the magnetic cores.

$I_{dc}$ (ISDN) or $I_{dc}$ (POTS) and $I_{ac}$ (POTS), in conjunction with $U_{ac}$ modulation, may not cause the low-pass filter 8 to go either into saturation or be modulated to such an extent that system-specific properties defined in the relevant standards are no longer met.

The inductances used on both sides of the public two-wire line 3 must meet the following requirements:

a) minimum unit volume b) suitable for the transmission, code systems
   DMT
   CAP
   QAM/MQAM ((Multiple) Quadrature Amplitude Modulation)

c) magnetizing inductances<100 mH depending on filter configuration d) DC superposition in power feed
   0–100 mA in POTS+$I_{ac}$, as a function of the configuration of the bell generator
   0–80 mA in ISDN e) loops in accordance with ANSI T1E1.413 and ETSI ETR 328 f) low core weight and SMD capability g) toroidal core, therefore simpler safety requirements in accordance with IEC 950.

These requirements may be met by small unslit toroidal tape cores made of an amorphous, nearly magnetostriction-free cobalt-based alloy or a practically magnetostriction-free fine crystalline alloy.

The latter are usually referred to as "nanocrystalline alloys" and are distinguished by an extremely fine grain with an average diameter of less than 100 nm, which makes up more than 50% of the material volume. An important prerequisite is that the inductances have a high saturation induction of $B_s$>0.6 T, preferably>0.9 T, and a very linear hysteresis loop with a saturation to remanence ratio $B_r/B_s$<0.2, preferably<0.08. Furthermore, the permeability must remain constant to a very large extent above 10 kHz in POTS splitters and far above 100 kHz in ISDN splitters. In addition it was found that low-pass filter chokes 9 for POTS splitters may also be made of some amorphous iron-based alloys. In either case, the saturation induction values, which are far above 1 Tesla, are of great advantage. A list of all alloy systems that were considered and found suitable for use in diplexers is provided below.

Figure 3:
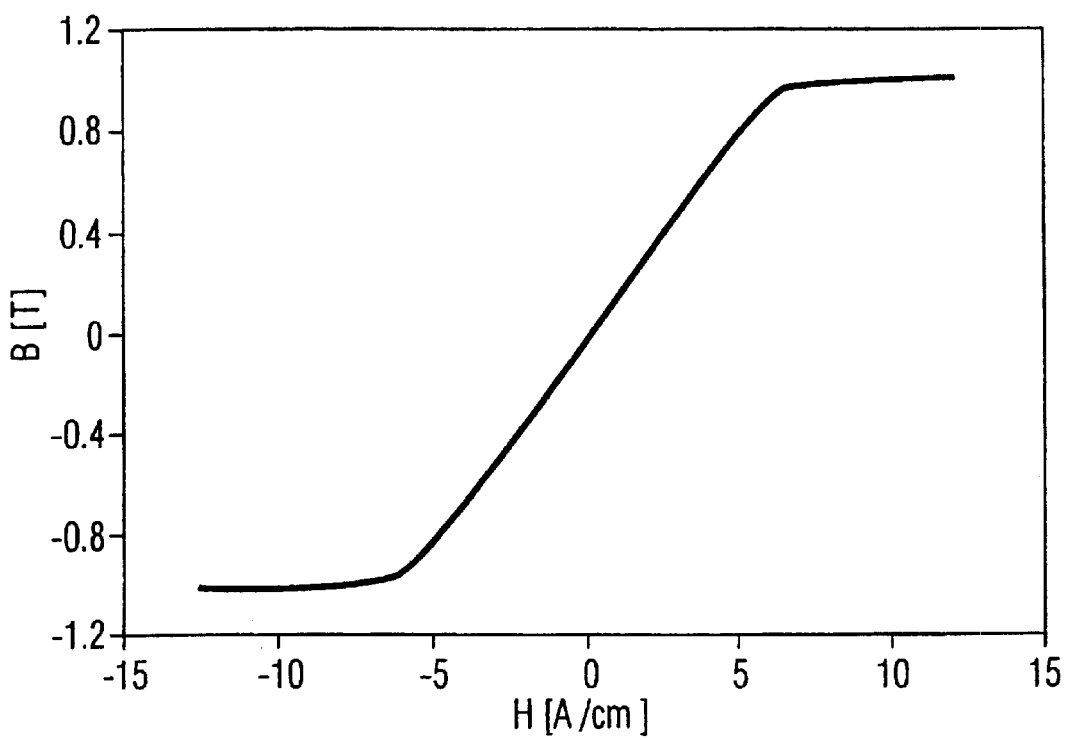
FIG. 3 shows a hysteresis loop with a high measure of linearity.

The basic prerequisite for obtaining the, properties required for POTS splitters and especially for ISDN splitters is a pronounced linearity characteristic of the hysteresis loops as depicted, for example, in FIG. 3. Such lineal hysteresis loops may be obtained, for example, by the process steps described below:

The magnetically soft amorphous ribbon with a thickness d<30 μm, preferably<23 μm, produced by means of rapid solidification technology from one of the alloys listed below is wound without tension on special machines to form the toroidal tape core in its final dimensions.

In the subsequent heat treatment to adjust the soft magnetic properties, a distinction must be drawn as to whether or not the core is made of an alloy that is suitable for establishing a nanocrystalline structure.

Toroidal tape cores made of alloys suitable for nanocrystallization are subjected to a crystallization heat treatment to adjust the nanocrystalline structure, which ranges from 450° C. to 680° C. depending on the alloy composition. Typical holding times range from 4 minutes to 8 hours. Depending on the alloy, this crystallization heat treatment under vacuum must be carried out in passive or reducing protective gas. In all cases, material-specific purity conditions must be taken into account, which must be brought about by corresponding agents on a case by case basis, e.g., by element-specific absorbers or getter materials. Through an exactly adjusted combination of temperature and time, use is made of the fact that in the alloy systems specified below, the magnetostriction contributions of the fine-crystalline grain and the amorphous residual phase are equalized and the required freedom from magnetostriction ($|\lambda_s|$<2 ppm, preferably even$|\lambda_s|$<0.2 ppm) is created. Depending on the alloy and the configuration of the low-pass filter choke 9, tempering is carried out either fieldless or in a magnetic field longitudinal to the direction of the wound ribbon ("direct-axis field") or perpendicular thereto ("quadrature-axis field"). In certain cases, a combination of two or even three of these-magnetic field constellations may become necessary. Particularly flat and linear loops can be obtained if the toroidal tape cores are precisely stacked end to end, so that the stack height is at least 10 times, preferably at least 20 times the core outside diameter, and a strong quadrature field is applied already during the described crystallization heat treatment. The hysteresis loop becomes all the flatter, the higher the quadrature field temperature is set, with all upper temperature limit being defined at the point where alloy-specific Curie temperatures are exceeded and non-magnetic phases are created.

Figure 4:
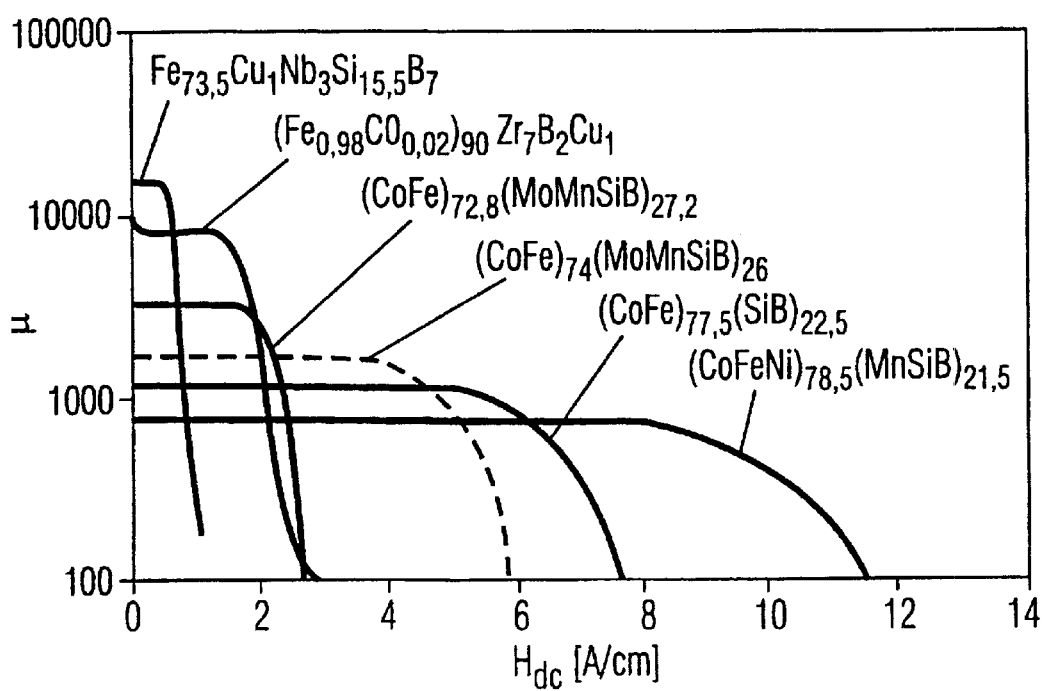
FIG. 4 is a diagram illustrating the dependence of permeability on the superimposed field strength.

The magnetic properties, i.e., the linearity and the slope of the hysteresis loop, can be varied over a wide range—if necessary—by an additional heat treatment in a magnetic field that is parallel to the rotational axis of symmetry of the toroidal tape core—i.e., normal to the tape direction. Depending on the alloy and the permeability level to be adjusted, temperatures of between 350° C. and 680° C. are required. Based on the kinetics of the atomic reorientation processes, the resultant permeability values are all the lower the higher the quadrature field temperature is. Typical characteristics of different nanocrystalline magnetic alloys used according to the invention are shown in FIG. 4. This magnetic field heat treatment may be either combined directly with crystallization annealing or carried out separately. For the annealing atmosphere the same conditions apply as those for annealing to adjust the nanocrystalline structure.

In toroidal tape cores made of amorphous materials the magnetic properties, i.e., course and slope of the linear flat hysteresis loop, are adjusted by a heat treatment in a magnetic field running parallel to the rotational axis of symmetry of the toroidal tape core—i.e., normal to the tape direction. Through proper control of the heat treatment it is possible to make use of the fact that the value of the saturation magnetostriction during the heat treatment changes in positive direction by an amount that depends on the alloy's composition until it meets the range $|\lambda_s|$<2 ppm, preferably even $|\lambda_s|$<0.1 ppm. As shown in Table 2, this can be achieved even if the amount of $\lambda_S$ in the as quenched state of the tape is clearly above this value. Important is that depending on the employed alloy, the toroidal tape core is purged with air or a reducing (e.g., $NH_3$, $H_2$, CO) or a passive protective gas (e.g.; He, Ne, Ar, $N_2$, $CO_2$) so that neither oxidation nor other reactions can occur on the tape surfaces. There may also be no solid state physical reactions in the interior of the material through inward diffusing protective gas.

Typically, the toroidal tape cores for the low-pass filter 8, depending on the employed alloy composition, are heated to temperatures of between 220° C. and 420° C. at a rate of 0.1 to 10 K/min as a magnetic field is applied, kept in this magnetic field and within this temperature range for 0.5 to 48 hours, and subsequently cooled again to room temperature at a rate of 0.1–5 K/min. Due to the temperature dependence of the magnetic moments, the resultant loops in the amorphous alloys used according to the invention are all the flatter and more linear, the lower the quadrature field temperatures are. Particularly flat and linear loops may be obtained if the toroidal tape cores are stacked end-to-end in such a way that the height of the stack is at least ten times, preferably at least 20 times the outside diameter of the core. Typical characteristics are shown in FIG. 4.

On a case by case basis, a temperature plateau in the quadrature field may be dispensed with and the preferred magnetic orientation produced by cooling the toroidal tape cores in the quadrature field. The permeability level is then adjusted via the cooling rate below the Curie temperature of the magnetic material.

Following the heat treatment, the toroidal tape cores are surface passivated, coated, fluidized-bed sintered or encapsulated in a trough, provided with windings and, if required, bonded or potted in the component housing. This process is independent of whether the toroidal tape core is made of an amorphous or a nanocrystalline material. Due to the brittleness, however, mechanical handling of the tempered nanocrystalline toroidal tape cores must be carried out very carefully.

A further production option is to subject the tape first to quadrature field tempering in a continuous process and then to wind it into the toroidal tape core. The further sequence corresponds to that described above.

The toroidal tape cores produced according to this process meet the following requirements:

The magnetizing inductance of the wound toroidal tape core, depending on the layout of the low-pass filter choke 9, ranges from 1 to 100 mH, in special configurations of low-pass filters 8 (e.g., elliptical characteristic) the magnetizing inductance is also<1 mH.

In addition, the magnetizing inductance also meets this value with DC superposition and maximum alternating modulation as well as the frequencies defined by standard.

The linearity error of the hysteresis loop of the toroidal tape core is so low that the following holds:

$\mu\ (4/5*B_s)/\mu\ (1/100*B_s)>0.7$, preferably>0.9.

The bit error rates that can be obtained in typical user circuits conform to the standards (FTZ 1TR220 and ETSI ETR 80).

Particularly when using an amorphous alloy of the composition $Co_{55.6}Fe_{6.1}Mn_{1.1}Si_{4.3}B_{16.2}Ni_{16.2}$, the typical minimum core dimensions shown in Table 1 result after balanced quadrature field tempering at 280° C.–360° C. for predefined values of magnetizing inductance and DC loadability.

TABLE 1

| $L_{magnet}$ [mH] | $I_{dc}$, max [mA] | Core Dimensions [mm³] | Core Weight [g] |
|---|---|---|---|
| 6.2 | 100 | 9.2 × 6.5 × 4.5 | 0.96 |
| 7.9 | 100 | 9.8 × 6.5 × 4.5 | 1.22 |
| 9.2 | 100 | 9.8 × 6.5 × 4.5 | 1.22 |
| 12.1 | 100 | 11.3 × 8.0 × 5.5 | 1.81 |
| 16.9 | 100 | 12.3 × 8.0 × 5.5 | 2.48 |
| 27.6 | 100 | 14.3 × 8.0 × 5.5 | 4.00 |

Similar core dimensions also result when using the other alloys listed below, which are employed for specific applications.

When dimensioning the low-pass filter chokes 9, a number of relations must be taken into account.

For the inductance of the transformer, the following relation holds:

$$L=N^2\mu_o\mu_rA_{fe}L_{fe} \quad (1)$$

N=number of turns
$\mu_o$=universal permeability constant
$\mu_r$=permeability of the material
$A_{fe}$=iron cross section of the toroidal tape core
$L_{fe}$=iron path length of the: toroidal tape core.

From equation (1) it is evident that the required inductance call be reached with the minimum unit volume only if the number of turns, permeability, core cross section and iron path length arc tuned relative to one another. The permeability of the core material, in addition to the favorable toroidal geometry, is the decisive parameter for the most compact possible dimensioning of the low-pass filter choke 9. Depending on which of the alloys listed below is used and how the associated heat treatment is conducted, a permeability range between 500 and 120,000 can be covered in a defined manner. In the low-pass filter chokes 9 suitable for use in ADSL systems, the permeability range below 20,000 is preferably used, which brings a high degree of flexibility with respect to dimensioning the inductances. The low-pass filters 8 built with these toroidal tape cores have a strong volume advantage compared to slit ferrite cores ($\mu$=100–400) as well as great electrotechnical advantages due to the low number of turns of the winding.

The selection of the core material for the inductances of the low-pass filter 8 is fundamentally limited in that the inductance may not be magnetized to near saturation by $I_{dc}$ (ISDN) or $I_{dc}$ (POTS) and $I_{ac}$ (POTS).

The direct currents superimposed on the: signal modulation lead to a direct field bias $$H_{dc}=I_{dc}N/L_{fe} \quad (2)$$

below which the permeability may drop only slightly. For this reason, the material is evaluated by means of $\mu(H_{dc})$ characteristics, such as those shown by way of example in FIG. 4 for different amorphous and nanocrystalline material core combinations developed for the low-pass filter chokes 9.

Since according to FIG. 4 the usable constant working range of the $\mu(H_{dc})$ characteristic depends on the magnitude of the anisotropy field strength $$H_a=B_s/(\mu_o*\mu_r) \quad (4)$$

the alloy composition in combination with the quadrature field heat treatment must be defined in such a way that on the one hand saturation induction is as high as possible while on the other hand permeability is as low as possible. However, since according to Equation 1 a particularly low permeability must be compensated by increasing the number of turns N, which in turn causes the direct field bias $H_{dc}$ defined in Equation 2 to increase, a compromise must be found between high anisotropy field strength and adequately high permeability when selecting the alloy and heat treatment for low-pass inductances.

When dimensioning the low-pass filter chokes 9, care must furthermore be taken that the magnitude of the impedance of the low-pass filter chokes 9 increases with increasing frequency, since this suppresses harmonics produced by non-linearities in the hysteresis loop of the toroidal tape core.

Figure 7:
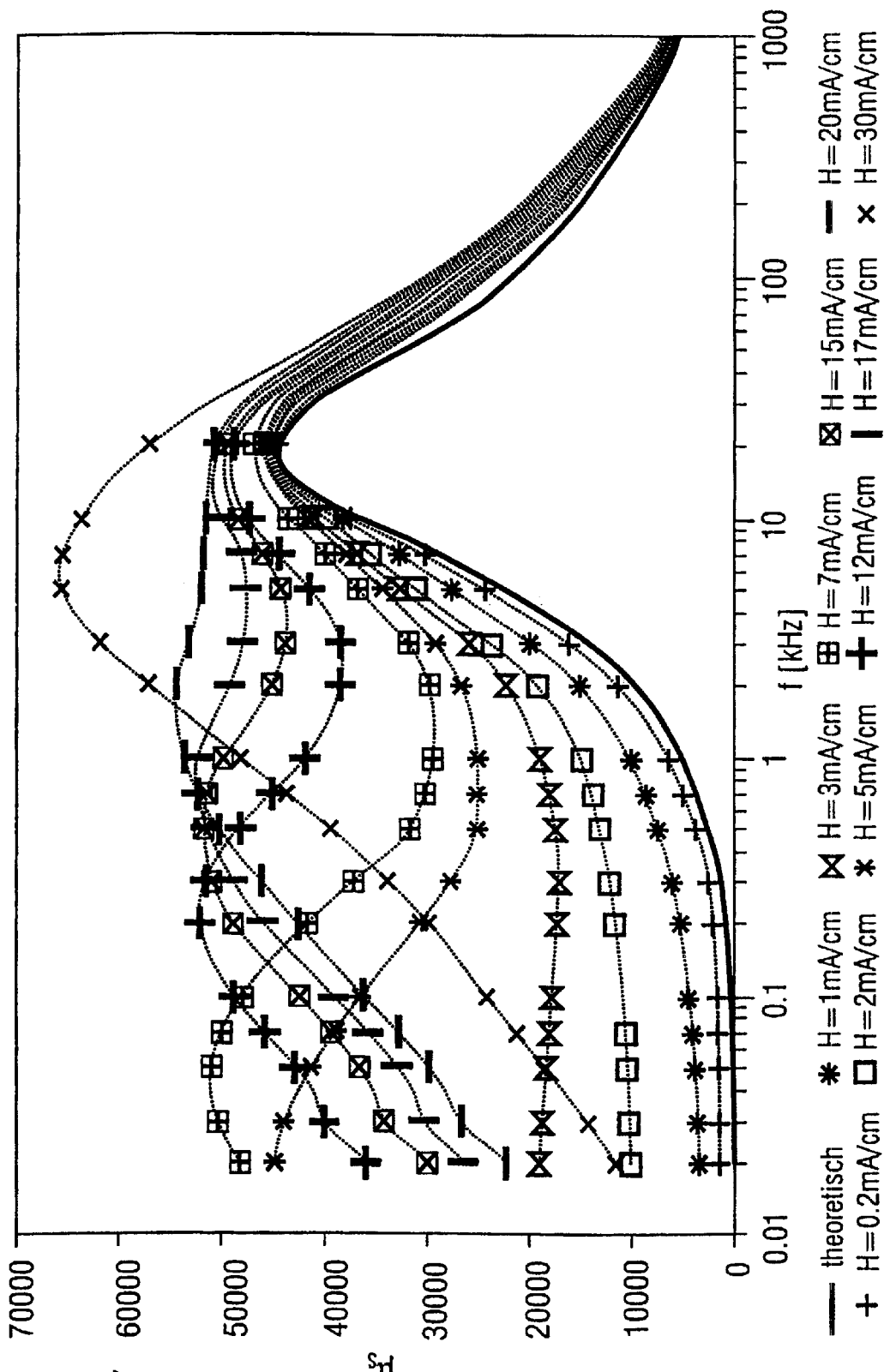
FIG. 7 shows the measured frequency response of the imaginary part of the permeability of a magnetic core with high surface roughness.

This will be explained in greater detail below by means of FIGS. 5 to 7.

In the serial equivalent circuit diagram, the low-pass filter choke 9 is represented by an ohmic resistance connected in series and an ideal inductance. The magnitude of the ohmic resistance is determined by the imaginary part of the permeability. The real part of the permeability on the other hand defines the magnitude of the ideal inductance.

FIG. 5 shows the typical dependence of the real part $\mu_s'$ and the imaginary part $\mu_s''$ of frequency f. The figure shows the course for two exemplary embodiments with different initial permeability. Curve 11 represents the course of the real part $\mu_s'$ of an exemplary embodiment with an initial permeability of 37.000. The dashed curve 12 indicates the course of the imaginary part $\mu_s''$ of this embodiment. Analogously, the solid curve 13 and the dashed line 14 respectively represent the real part $\mu_s'$ and the imaginary part $\mu_s''$ of an exemplary embodiment with an initial permeability of 800.

Based on FIG. 5 it may be seen that the imaginary parts $\mu_s''$ of the permeability have a maximum at an eddy current critical frequency $f_g$. Within the range of the same frequency, the real part $\mu_s'$ of the permeability begins to drop.

FIG. 6 shows the resultant course of the magnitude of impedance Z. The two embodiments are designed in such a way that they have the same inductance at least at low frequencies. Accordingly, the toroidal tape core with an initial permeability of 800 is wound with 48 turns, while the toroidal tape core with an initial permeability of 37,000 is wound with 8 turns. Since both low-pass filter chokes 9 have the same inductance at low frequencies, a curve 15 characteristic for the embodiment with the high initial permeability differs only slightly for low frequencies from a curve 16 characteristic for the embodiment with high initial permeability. At the eddy current critical frequency $f_g$, however, curve 15 begins to flatten out somewhat and then finally drops due to the capacity of the winding above a maximum. The same applies to curve 16. When it approaches the critical frequency $f_g$, curve 16 begins to flatten out somewhat before it finally drops on the other side of a maximum due to the large capacity of the winding formed by 48 turns.

The frequency response of the impedance also affects the filter quality of the low-pass filter 8. The harmonics of the low frequency signal produced by the non-linearities of the hysteresis loop can be imagined to be produced by an interfering voltage source that is connected to a terminating resistance at which the output signal is picked off. The internal resistance of the interfering voltage source is then determined by the impedance of the low-pass filter choke 9. Since at high frequencies the impedance of the low-pass filter choke 9 strongly increases, the interfering voltage produced by the interfering voltage source drops primarily at the internal resistance of the interfering voltage source and not at the terminating resistance. In this manner, the harmonics of the low frequency signal produced by non-linearities of the hysteresis loop are effectively suppressed. This presumes, however, a sufficiently strong impedance increase at high frequencies. This increase in the impedance should occur at least up to the fifth harmonic, preferably up to the eleventh harmonic. FIG. 6 clearly shows that in this connection it is advantageous in principle if the initial permeabilities are selected low, so that based on the high eddy current critical frequency the impedance strongly increases even at high frequencies. In contrast to exemplary embodiments in which the initial permeability is selected high, this has the additional advantage that the toroidal tape core is modulated very little due to the low permeability. Since in this case only a small part of the hysteresis loop is descending, non-linearities that occur with large modulation of the toroidal tape core are of less consequence.

It should be noted that the relations shown in FIGS. 5 and 6 are true only if other dissipative effects aside from the generation of eddy currents are to be ignored. For example, if during production of the toroidal tape cores, heat treatment takes place with inadequate purging with protective gas, $SiO_2$ layers may grow on the surface of the magnetic tapes, which increase the domain walls in the magnetic tape. The accompanying roughnesses of the tape surface furthermore represent seeds for wall shifting processes. Conversely, demagnetized fields are formed due to the surface roughness, which prevents rapid demagnetization. Furthermore, migration of the domain walls induces strong eddy currents that counteract the shifting of the domain walls. Overall, the shifting of the domain walls in the alternating field represents a further dissipative process, which at frequencies far below the eddy current frequency may lead to a further maximum of the imaginary part $\mu_s''$ of the permeability. FIG. 7 shows the frequency response of the imaginary part $\mu_s''$ of the permeability as a function of the strength of the applied external magnetic field. Since the above-described effects are more or less pronounced as a function of the strength of the applied external magnetic field, the frequency response of the imaginary part $\mu_s''$ of the permeability depends not only on the frequency but also on the strength of the applied external magnetic field. It is therefore essential to wind the toroidal tape cores as stress-free as possible and to carry out the heat treatment in a flowing protective gas atmosphere.

If the above conditions are met, the alloy system described below makes it possible to produce low-pass filters that have all the properties in conformance with standards, with particularly linear hysteresis loops and small configurations.

Alloy System 1:

An alloy system suitable for POTS low-pass filters has the composition $Fe_a M_b Si_x B_y R_z$, where M stands for one or more elements from among the group Co, Ni and R for one or more elements from among the group C, V, Nb, Mn, Ti, Cr, Mo, W, and a+b+x+y+z=100%, where

| | |
|---|---|
| Fe | a = 61–82 at % |
| Co/Ni | b = 0–20 at % |
| Si | x = 0.5–19 at % |
| B | y = 7–23 at % |
| R | z = 0–3 at % | where 70<a+b<86, preferably 73<a+b<85 at % and 14<x+y+z<30 at %.

Alloys of this system remain amorphous after heat treatment, but due to their relatively large saturation magnetostriction, which may be+20 ppm, their linearity characteristics are not quite as pronounced as those of the following Co-based alloys. They are therefore primarily suitable for POTS low-pass filters.

Alloy System 2:

A further suitable alloy system has the composition $Co_a(Fe_{1-x}Mn_x)_bNi_d M_eSi_xB_yC_z$, where M is one or more elements from among the group Nb, Mo, Ta, Cr, W, Ge and/or P and a+b+c+d+e+x+y+z=100, where

| Co | a = 40–82 at % | preferably a > 50 at % |
|---|---|---|
| Mn/Fe | x = 0–1 | preferably x < 0.5 |
| Fe + Mn | b = 3–10 at % | |
| Ni: | d = 0–30 at % | preferably d < 20 at % |
| M: | e = 0–5 at % | preferably e < 3 at % |
| Si: | x = 0–15 at % | preferably x > 1 at % |
| B | y = 8–26 at % | preferably 8–20 at % |
| C | z = 0–3 at % | |

15<e+x+y+z<30 (preferably 18<e+x+y+z<25).

Alloys of this system remain amorphous after heat treatment, meet the requirement $|\lambda_s|<0.1$ ppm particularly well and, due to their linear loop form and the extremely good frequency response, are particularly well suited for both ISDN and POTS low-pass filters.

Alloy System 3:

A third suitable alloy system has the composition $Fe_xCu_yM_zSi_vB_w$, where M is an element from among the group Nb, W, Ta, Zr, Hf, Ti, Mo, or a combination thereof, and x+y+z+v+w=100%, where:

| Fe | x = 100% – y – z – v – w | |
|---|---|---|
| Cu | y = 0.5–2 at % | preferably 1 at % |
| M | z = 1–5 at % | preferably 2–3 at % |
| Si | v = 6.5–18 at % | preferably 14–17 at % |
| B | w = 5–14 at % | | where v+w>18 at %, preferably v+w=22–24 at %.

Alloys of this system, due to their linear loop form and the very good frequency response, are well suited for both ISDN and POTS low-pass filters.

Alloy System 4:

A further suitable alloy system has the composition $Fe_xZr_yNb_zB_vCu_w$, where x+y+z+v+w=100 at %, where:

| Fe | 100 = 100 at % – y – z – v – w | preferably 83 . . . 86 at % |
|---|---|---|
| Zr | y = 2–5 at % | preferably 3–4 at % |
| Nb | z = 2–5 at % | |
| B | v = 5–9 at % | |
| Cu | w = 0.5–1.5 at % | preferably 1 at % | where y+z>5 at %, preferably 7 at % and y+z+v>11, preferably 12–16 at %.

Alloys of this system, due to their lineal loop form and their very good frequency response, are well suited for both ISDN and POTS low-pass filters.

Alloy System 5:

A further alloy system has the composition $Fe_xM_yB_zCu_w$, where M is an element from among the group Zr, Hf, Nb and x+y+z+w=100 at %, where:

| Fe | x = 100 at % – y – z – w | preferably 83–90 at % |
|---|---|---|
| M | y = 6–8 at % | preferably 7 at % |
| B | z = 3–9 at % | |
| Cu | w = 0–1.5 at % | |

Alloys of this system, due to their linear loop form and their very good frequency response, are well suited for both ISDN and POTS low-pass filters.

Alloy System 6:

A sixth alloy system suitable for low-pass filters in diplexers has the composition $(Fe_{0.98}C_{0.02})_{90-x}Zr_7B_{2+x}Cu_1$ where x=0–3, preferably x=0, wherein Co may be replaced by Ni with corresponding adjustment of the remaining alloy components.

Alloys of this system, due to their linear loop form and their very good frequency response, are well suited for both ISDN and POTS low-pass filters.

After heat treatment, the alloy systems 3 to 6 receive a fine crystalline structure with grain diameters of less than 100 nm. These grains are surrounded by an amorphous phase which, however, makes up less than 50% of the material volume.

Alloy System 7:

POTS low-pass filters may furthermore be produced from metal tape cores of crystalline rolled ribbons. To achieve the necessary frequency characteristics of the permeability, the ribbon thickness must be less than 50 pm, preferably less than 30 pm. A functional alloy system was found to be:

$$Ni_xFe_yM_z$$

where M is one or more elements from among the group Nb, Mo, Mn, Si, Al, Ti, Cr and x+y+z=100 at % where

| Ni | x = 35–68 at % | preferably 50–65 at % |
|---|---|---|
| Fe | y = 100 at % – x – z | |
| M | z = 0–9 at % | preferably 0.5–3 at % |

In the production of the metal tape cores, depending on the alloy composition, a further tempering treatment in the range of 450° C.–650° C. may be necessary in addition to recrystallization annealing at 800–1250° C. To meet the linearity characteristics conforming to standards, both treatments must be carried out in a protective reducing gas. To achieve a flat linear hysteresis loop, the preferred magnetic direction is adjusted, depending on the Ni content, either by a quadrature field heat treatment or by cold forming, e.g., by an additional rolling step.

Aside from the alloys of Groups 1 to 6, which are useful for POTS low-pass filters, additional characteristics of the preferred alloy systems 2 to 6 are:

- extremely linear hysteresis loop with at least H=600 mA/cm or higher,
- Magnitude of saturation magnetostriction $|\lambda_s|<2$ ppm, preferably<0.1 ppm after heat treatment. In the cobalt-based amorphous materials, the saturation magnetostriction may be adjusted by correspondingly fine-tuning the Fe and Mn content. In the nanocrystalline alloys, the saturation induction may be adjusted via the size of the fine crystalline grain, which can be accomplished by a specific tuning of the heat treatment and the metalloid content.

Saturation induction of 0.7 T–1.7 T; the saturation induction can be fine-tuned through the selection of the Ni, Co, M, Si, B and C content.

In the above alloy systems the less than/greater than symbols include the limits; all at % indicated are approximate values.

Particularly the alloy examples listed in Table 2 meet and satisfy the aforementioned requirements and alloy ranges after the described heat treatment has been carried out. Based on their combination of a particularly low constant permeability and a saturation induction of nearly 1 Tesla, the examples of amorphous cobalt-based alloys listed in Table 2 exhibit particularly high anisotropy field strengths, in some cases more than 8 A/m. In contrast, the fine and nanocrystalline alloys also listed in Table 2 are distinguished by particularly high saturation induction values up to 1.7 Tesla. They permit comparatively high permeability values, which according to the invention provides further advantages compared to ferrite transformers with respect to overall dimensions and winding.

TABLE 2

| Alloy Composition [at %] | Structure | Saturation Induction [T] | Anisotropy Field Strength $H_a$ [A/cm] | Saturation Magnetostriction $\lambda_s$ | |
|---|---|---|---|---|---|
| | | | | as quenched | heat-treated |
| $Co_{71.7}Fe_{1.1}Mo_1Mn_4Si_{13.2}B_9$ | amorphous | 0.82 | 1.5 | $-12 * 10^{-8}$ | $-3.5 * 10^{-8}$ |
| $Co_{72.5}Fe_{1.5}Mo_{0.2}Mn_4Si_{4.8}B_{17}$ | amorphous | 1.0 | 3.5 | $-12 * 10^{-8}$ | $-4.1 * 10^{-8}$ |
| $Co_{72.8}Fe_{4.7}Si_{5.5}B_{17}$ | amorphous | 0.99 | 4.8 | $-32 * 10^{-8}$ | $-1.6 * 10^{-8}$ |
| $Co_{55.6}Fe_{6.1}Mn_{1.1}Si_{4.3}B_{16.2}Ni_{16.5}$ | amorphous | 0.93 | 8.0 | $-110 * 10^{-8}$ | $+4.2 * 10^{-8}$ |
| $Fe_{73.5}Cu_1Nb_3Si_{15.5}B_7$ | nanocryst. | 1.21 | 0.7 | $+24 * 10^{-6}$ | $+1.6 * 10^{-7}$ |
| $(Fe_{0.98}Co_{0.02})_{90}Zr_7B_2Cu_1$ | nanocryst. | 1.70 | 1.7 | — | $-1.0 * 10^{-7}$ |
| $Fe_{84}Zr_{3.5}Nb_{3.5}B_8Cu_1$ | nanocryst. | 1.53 | 0.8 | $+3 * 10^{-6}$ | $+1.5 * 10^{-7}$ |
| $Fe_{84}Nb_7B_9$ | nanocryst. | 1.5 | 1.2 | — | $+1.0 * 10^{-7}$ |

What is claimed is:

1. Low-pass filter for a diplexer for separating low frequency signals of analog communications systems from high frequency signals of digital communications systems, the low-pass filter comprising a plurality of longitudinal inductances connected in series, such longitudinal inductances (i) comprising magnetic cores made of an amorphous or nanocrystalline alloy, (ii) having impedance which increases with increasing frequency and suppresses harmonics of the low-frequency signals, and (iii) having a saturation induction $B_s > 0.6T$, a saturation to remanence ratio $B_r/B_s < 0.2$ and a permeability that is constant to a very large extent up to above 10 kHz.

2. Low-pass filter as claimed in claim 1 characterized in that the alloy has the composition $Fe_aM_bSi_xB_yR_z$, where M is one or more elements from among the group Co, Ni and R is one or more elements from among the group C, V, Nb, Mn, Ti, Cr, Mo, W and a+b+x+y+z=100%, where:

| Fe | a = 61–82 at –% |
|---|---|
| Co/Ni | b = 0–20 at –% |
| Si | x = 0.5–19 at –% |
| B | y = 7–23 at –% |
| R | z = 0–3 at –% | where 70<a+b<86 at-% and 14<x+y+z<30 at-%.

3. Low-pass filter as claimed in claim 2 characterized in that the relation 73<a+b<85 at-% is true for a and b.

4. Low-pass filter as claimed in claim 1 characterized in that the alloy has the composition $Co_a(Fe_{1-x}Mn_x)_b$ $(Ni_dM_eSi_xB_yC_z)$, the alloy has the composition $Co_a(Fe_{1-x}Mn_x)_b$ $Ni_dM_eSi_xB_yC_z$, where M is one or more elements from among the group Nb, Mo, Ta, Cr, W, Ge and P and a+b+c+d+e+x+y+z= 100, where:

| Co | a = 40–82 at % |
|---|---|
| Mn/Fe | x = 0–1 |
| Fe + Mn | b = 3–10 at % |
| Ni | d = 0–30 at % |

-continued

| M | e = 0–5 at % |
|---|---|
| Si | x = 0–15 at % |
| B | y = 8–26 at % |
| C | z = 0–3 at % | where 15<e+x+y+z<30.

5. Low-pass filter as claimed in claim 4, characterized in that the following relations hold:

| C | a = 50–82 at % |
|---|---|
| Mn/Fe | x = 0–0.5 |
| Fe + Mn | b = 3–10 at % |
| Ni | d = 0–20 at % |
| M | e = 0–3 at % |
| Si | x = 1–15 at % |
| B | v = 8–20 at % |
| C | z = 0–3 at % | where 18<e+x+y+z<25.

6. Low-pass filter as claimed in claim 1, characterized in that the alloy has the composition $Fe_xCu_yM_zSi_vB_w$, where M is one or more elements from among the group Nb, W, Ta, Zr, Hf, Ti, Mo and x+y+z+v+w=100%, where:

| | |
|---|---|
| Fe | x = 100% − y − z − v − w |
| Cu | y = 0.5 − 2 at % |
| M | z = 1 − 5 at % |
| Si | v = 6.5 − 18 at % |
| B | w = 5 − 14 at % | where v+w>18 at %.

7. Low-pass filter as claimed in claim 6, characterized in that the following relations hold:

| | |
|---|---|
| Fe | x = 100% − y − z − v − w |
| Cu | y = 1 at % |
| M | z = 2 − 3 at % |
| Si | v = 14 − 17 at % |
| B | w = 5 − 14 at % | where v+w=22–24 at %.

8. Low-pass filter as claimed in claim 1, characterized in that the alloy has the composition $Fe_xZr_yNb_zB_vCu_w$, where x+y+z+v+w=100 at %, where:

| | |
|---|---|
| Fe | x = 100 at % − y − z − v − w |
| Zr | v = 2 − 5 at % |
| Nb | z = 2 − 5 at % |
| B | v = 5 − 9 at % |
| Cu | w = 0.5 − 1.5 at % | where y+z>5 at %
and y+z+v>11.

9. Low-pass filter as claimed in claim 8, characterized in that the following relations hold:

| | |
|---|---|
| Fe | x = 83 − 86 at % |
| Zr | y = 3 − 4 at % |
| Nb | z = 2 − 5 at % |
| B | v = 5 − 9 at % |
| Cu | w = 1 at % | where x+z>7 at %, and y+z+v is 12–16 at %.

10. Low-pass filter as claimed in claim 1, characterized in that the alloy has the composition $Fe_xM_yB_zCu_w$, where M is an element from among the group Zr, Hf, Nb and x+y+z+w=100 at %, where:

| | |
|---|---|
| Fe | x = 100 at % − y − z − w |
| M | y = 6 − 8 at % |

-continued

| | |
|---|---|
| B | z = 3 − 9 at % |
| Cu | w = 0 − 1.5 at %. |

11. Low-pass filter as claimed in claim 10, characterized in that the following relations hold:

| | |
|---|---|
| Fe | x = 83 − 90 at % |
| M | y = 7 at % |
| B | z = 3 − 9 at % |
| Cu | w = 0 − 1.5 at %. |

12. Low-pass filter as claimed in claim 1, characterized in that the alloys have the composition $(Fe_{0.98}Co_{0.02})_{90-x}Zr_7B_{2+x}Cu_1$, where x=0–3, wherein Co may be replaced by Ni with a corresponding adjustment of the remaining alloy components.

13. Low-pass filter as claimed in claim 12, characterized in that x=0.

14. Low-pass filter as claimed in claim 1, characterized in that the alloy has the composition $Ni_xFe_yM_z$, where M is one or more elements from among the group Nb, Mo, Mn, Si, Al, Ti, Cr and x+y+z=100 at %, where

| | |
|---|---|
| Ni | x = 35 − 68 at % |
| Fe | y = 100 at % − x − z |
| M | z = 0 − 9 at %. |

15. Low-pass filter as claimed in claim 14, characterized in that x=50–65 at % and z=0.5–3 at %.

16. Low-pass filter for a diplexer, the filter comprising means for separating low-frequency signals of analog communications systems from high-frequency signals of digital communications systems, the separating means comprising a plurality of series-connected inductive chokes, each choke.having a magnetic core made of a toroidal tape of an iron-containing alloy and an impedance which increases with increasing frequency and suppresses harmonics of the low-frequency signals.

17. Low-pass filter for a diplexer for separating low frequency signals of analog communications systems from high frequency signals of digital communications systems, the low-pass filter comprising a plurality of longitudinal inductances connected in series, such longitudinal inductances (i) comprising magnetic cores made of an alloy and (ii) having impedance which increases with increasing frequency and suppresses harmonics of the low-frequency signals.

* * * * *